United States Patent
Yu et al.

(10) Patent No.: US 9,059,048 B2
(45) Date of Patent: Jun. 16, 2015

(54) ARRAY SUBSTRATE WITH ESD ASSEMBLY AND SHORT-CIRCUIT RING

(71) Applicants: BOE TECHNOLOGY GROUP CO., LTD., Beijing (CN); BEIJING BOE DISPLAY TECHNOLOGY CO., LTD., Beijing (CN)

(72) Inventors: Haifeng Yu, Beijing (CN); Bin Feng, Beijing (CN); Hongtao Lin, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/102,170

(22) Filed: Dec. 10, 2013

(65) Prior Publication Data

US 2014/0306227 A1 Oct. 16, 2014

(30) Foreign Application Priority Data

Dec. 13, 2012 (CN) .......................... 2012 1 0540752

(51) Int. Cl.
| | |
|---|---|
| *H01L 29/04* | (2006.01) |
| *H01L 31/036* | (2006.01) |
| *H01L 31/0376* | (2006.01) |
| *H01L 31/20* | (2006.01) |
| *H01L 27/12* | (2006.01) |
| *H01L 23/60* | (2006.01) |

(52) U.S. Cl.
CPC .......... *H01L 27/124* (2013.01); *H01L 27/1259* (2013.01); *H01L 23/60* (2013.01); *H01L 2924/0002* (2013.01)

(58) Field of Classification Search
CPC ............ H01L 27/1214; H01L 27/0248; H01L 27/0292; H01L 29/4908
USPC .................. 257/59, 60, 72, E29.117, E29.273
See application file for complete search history.

(56) References Cited

U.S. PATENT DOCUMENTS

| | | | | |
|---|---|---|---|---|
| 5,798,534 | A * | 8/1998 | Young .............................. | 257/59 |
| 2012/0056186 | A1 * | 3/2012 | Shirouzu ......................... | 257/59 |

FOREIGN PATENT DOCUMENTS

CN 202183003 U 4/2014

OTHER PUBLICATIONS

English translation of Office Action dated Sep. 29, 2014 received in corresponding Chinese Application No. 2012105407585.

* cited by examiner

*Primary Examiner* — Hoai V Pham
(74) *Attorney, Agent, or Firm* — Kinney & Lange, P.A.

(57) ABSTRACT

A display apparatus, an array substrate, and a method for producing the array substrate are provides to so as to effectively reduce a horizontal distance occupied by the ESD assembly at each side of the display region of the substrate and achieve a good performance of the narrow edge frame of the TFT-LCD. The array substrate comprises a pixel region and a periphery wiring region, wherein an Electro-Static Discharge (ESD) assembly and a short-circuit ring are disposed in the periphery wiring region, and wherein the ESD assembly comprises a plurality of Thin Film Transistors (TFTs) each having a source electrode and a drain electrode that are disposed within the short-circuit ring.

20 Claims, 7 Drawing Sheets

ARRAY SUBSTRATE WITH ESD ASSEMBLY AND SHORT-CIRCUIT RING

CROSS-REFERENCE TO RELATED APPLICATION

This application claims the benefit of Chinese Patent Application No. 201210540758.5 filed on Dec. 13, 2012 in the State Intellectual Property Office of China, the whole disclosure of which is incorporated herein by reference.

BACKGROUND OF THE INVENTION

1. Field of the Invention

The present invention relates to a display technology field, more particularly, relates to a display apparatus, an array substrate, and a method for producing the array substrate.

2. Description of the Related Art

Recently, with the development and improvement of the technology of the TFT-LCD (Thin Film Transistor Liquid Crystal Display), the TFT-LCD with a narrow edge frame becomes popular in consumers.

In a process of producing the TFT-LCD, it is very important to provide an electrostatic protection for the TFT-LCD in the entire process. In order to avoid the static electricity to disadvantageously affect the quality of the TFT-LCD, in prior arts, an ESD (Electro-Static Discharge) assembly constructed by reversely connecting diodes is often used to provide a good electrostatic protection for the TFT-LCD.

However, in the prior arts, the ESD assembly occupies a space in a display region of a substrate. In this way, it needs to leave a certain space for the ESD assembly in the display region of the substrate, and hinders the narrowing of the edge frame of the TFT-LCD. As a result, after assembled, the edge frame of the TFT-LCD is very wide, and it cannot achieve the performance of the TFT-LCD with a narrow edge frame.

SUMMARY OF THE INVENTION

The present invention has been made to overcome or alleviate at least one aspect of the above mentioned disadvantages.

Accordingly, it is an object of the present invention to provide a display apparatus, an array substrate, and a method for producing the array substrate so as to effectively reduce a horizontal distance occupied by the ESD assembly at each side of the display region of the substrate and achieve a good performance of the narrow edge frame of the TFT-LCD.

According to an aspect of the present invention, there is provided an array substrate comprising a pixel region and a periphery wiring region, wherein an Electro-Static Discharge (ESD) assembly and a short-circuit ring are disposed in the periphery wiring region, and wherein the ESD assembly comprises a plurality of Thin Film Transistors (TFTs) each having a source electrode and a drain electrode that are disposed within the short-circuit ring.

In the above mentioned array substrate, the source electrodes and the drain electrodes of the TFTs are formed in the same layer by a single patterning process.

In the above mentioned array substrate, one kind of electrodes of the source electrodes and the drain electrodes of the TFTs are connected to the short-circuit ring, and the other kind of electrodes are connected to each other and separated from the short-circuit ring.

In the above mentioned array substrate, the ESD assembly comprises a first TFT and a second TFT; drain electrodes of the first and second TFTs are spaced opposite to each other and connected to the short-circuit ring; and source electrodes of the first and second TFTs are connected to each other and separated from the short-circuit ring.

In the above mentioned array substrate, gate electrodes of the first and second TFTs are located within a coverage area of the short-circuit ring.

In the above mentioned array substrate, the gate electrodes of the first and second TFTs and a gate line of the pixel region are formed in the same layer by a single patterning process; the gate line of the pixel region extends to the periphery wiring region and is connected to the gate electrode of the first TFT; and the gate electrode of the second TFT is separated from the gate electrode of the first TFT and the gate line.

In the above mentioned array substrate, the gate electrode of the first TFT is electrically connected to the source electrode of the first TFT through a first transparent conductive layer; the gate electrode of the second TFT is electrically connected to the drain electrode of the second TFT and the short-circuit ring through a second transparent conductive layer; and the first and second transparent conductive layers are formed in the same layer by a single patterning process.

According to another aspect of the present invention, there is provided a display apparatus comprising the above mentioned array substrate.

According to another aspect of the present invention, there is provided a method for producing an array substrate, the array substrate comprising a pixel region where a gate line is disposed and a periphery wiring region where a short-circuit ring and an Electro-Static Discharge (ESD) assembly having a plurality of Thin Film Transistors (TFTs) are disposed, wherein the method comprising:

forming source electrodes and drain electrodes of the TFTs within the short-circuit ring.

In the above mentioned method, the source electrodes and the drain electrodes of the TFTs are formed in the same layer by a single patterning process.

In the above mentioned method, one kind of electrodes of the source electrodes and the drain electrodes of the TFTs are connected to the short-circuit ring, and the other kind of electrodes are connected to each other and separated from the short-circuit ring.

In the above mentioned method, the ESD assembly comprises a first TFT and a second TFT; drain electrodes of the first and second TFTs are spaced opposite to each other and connected to the short-circuit ring; and source electrodes of the first and second TFTs are connected to each other and separated from the short-circuit ring.

In the above mentioned method, gate electrodes of the first and second TFTs are located within a coverage area of the short-circuit ring.

In the above mentioned method, the gate electrodes of the first and second TFTs and the gate line of the pixel region are formed in the same layer by a single patterning process; the gate line of the pixel region extends to the periphery wiring region and is connected to the gate electrode of the first TFT; and the gate electrode of the second TFT is separated from the gate electrode of the first TFT and the gate line.

In the above mentioned method, the gate electrode of the first TFT is electrically connected to the source electrode of the first TFT through a first transparent conductive layer; the gate electrode of the second TFT is electrically connected to the drain electrode of the second TFT and the short-circuit ring through a second transparent conductive layer; and the first and second transparent conductive layers are formed in the same layer by a single patterning process.

According to another aspect of the present invention, there is provided a method for producing an array substrate, the array substrate comprising a pixel region where a gate line is disposed and a periphery wiring region where a short-circuit ring and an Electro-Static Discharge (ESD) assembly having a first Thin Film Transistors (TFT) and a second TFT are disposed, wherein the method comprising:

S100: forming the gate line, a gate electrode of the first TFT and a gate electrode of the second TFT on a substrate by a single patterning process, wherein the gate line is connected to the gate electrode of the first TFT and separated from the gate electrode of the second TFT;

S200: forming a first insulation layer on the gate line and the gate electrodes;

S300: forming a first TFT active layer and a second TFT active layer on the first insulation layer by a single patterning process;

S400: forming source electrodes and drain electrodes of the first and second TFTs and the short-circuit ring on the first and second TFT active layers by a single patterning process, wherein the short-circuit ring is formed with a first opening therein to expose the gate electrode of the second TFT, one kind of electrodes of the source electrodes and the drain electrodes of the first and second TFTs are connected to each other and separated from the short-circuit ring, and the other kind of electrodes are connected to the short-circuit ring;

S500: forming a second insulation layer on the source electrodes and the drain electrodes of the first and second TFTs and the short-circuit ring; and S600: forming a first transparent conductive layer and a second transparent conductive layer on the second insulation layer by a single patterning process, wherein a first via for exposing the gate line and a second via for exposing the gate electrode of the second TFT are formed in the first and second insulation layers, and a third via for exposing the one kind of electrodes of the first and second TFTs and a fourth via for exposing the short-circuit ring are formed in the second insulation layer, wherein the first transparent conductive layer is connected to the gate line through the first via and connected to the one kind of electrodes of the first and second TFTs through the third via, so that the one kind of electrodes of the first and second TFTs is connected to the gate line, wherein the second transparent conductive layer is connected to the gate electrode of the second TFT through the second via and the first opening and connected to the short-circuit ring through the fourth via, so that the gate electrode of the second TFT is connected to the other kind of electrodes of the first and second TFTs and the short-circuit ring, and wherein the source electrodes and drain electrodes of the TFTs are formed within the short-circuit ring.

In the above mentioned method, the drain electrodes of the first and second TFTs are spaced opposite to each other and connected to the short-circuit ring; and the source electrodes of the first and second TFTs are connected to each other and separated from the short-circuit ring.

In the above mentioned method, the gate electrodes of the first and second TFTs are located within a coverage area of the short-circuit ring.

In the above mentioned method, the short-circuit ring, the source electrodes and the drain electrodes of the first and second TFTs, and a data line of the pixel region are formed by a single patterning process.

In the above mentioned method, the first via in the pixel region and the second, third and fourth vias in the periphery wiring region are formed by a single patterning process.

The present invention provides, in exemplary embodiments, a display apparatus, an array substrate and a method for producing the array substrate. The source electrodes and the drain electrodes of the TFTs of the ESD assembly may be disposed within the short-circuit ring, so as to effectively reduce a horizontal distance occupied by the ESD assembly at each side of the display region of the substrate. At the same time, it offsets the position of the entire periphery circuit toward the display region, and can effectively reduce a distance between the display region and an edge of a glass panel, thereby achieving a good performance of the narrow edge frame of the TFT-LCD and enhancing the market competition of the TFT-LCD.

BRIEF DESCRIPTION OF THE DRAWINGS

The above and other features of the present invention will become more apparent by describing in detail exemplary embodiments thereof with reference to the accompanying drawings, in which:

FIGS. 2-7 show the respective processes for producing the array substrate of FIG. 1, in which:

FIG. 2 is an illustrative view of forming a gate line, a gate electrode of a first TFT and a gate electrode of a second TFT on a substrate of the array substrate shown in FIG. 1;

FIG. 3 is an illustrative view of forming a first insulation layer on the gate line and gate electrodes shown in FIG. 2;

FIG. 4 is an illustrative view of forming a first TFT active layer and a second TFT active layer on the first insulation layer shown in FIG. 3;

FIG. 5 is an illustrative view of forming source electrodes and drain electrodes of the first and second TFTs and the short-circuit ring on the first and second TFT active layers shown in FIG. 4;

FIG. 6 is an illustrative view of forming a second insulation layer on the source electrodes and drain electrodes of the first and second TFTs and the short-circuit ring shown in FIG. 5; and FIG. 7 is an illustrative view of forming a first transparent conductive layer and a second transparent conductive layer on the second insulation layer shown in FIG. 6.

DETAILED DESCRIPTION OF PREFERRED EMBODIMENTS OF THE INVENTION

Figure 1:
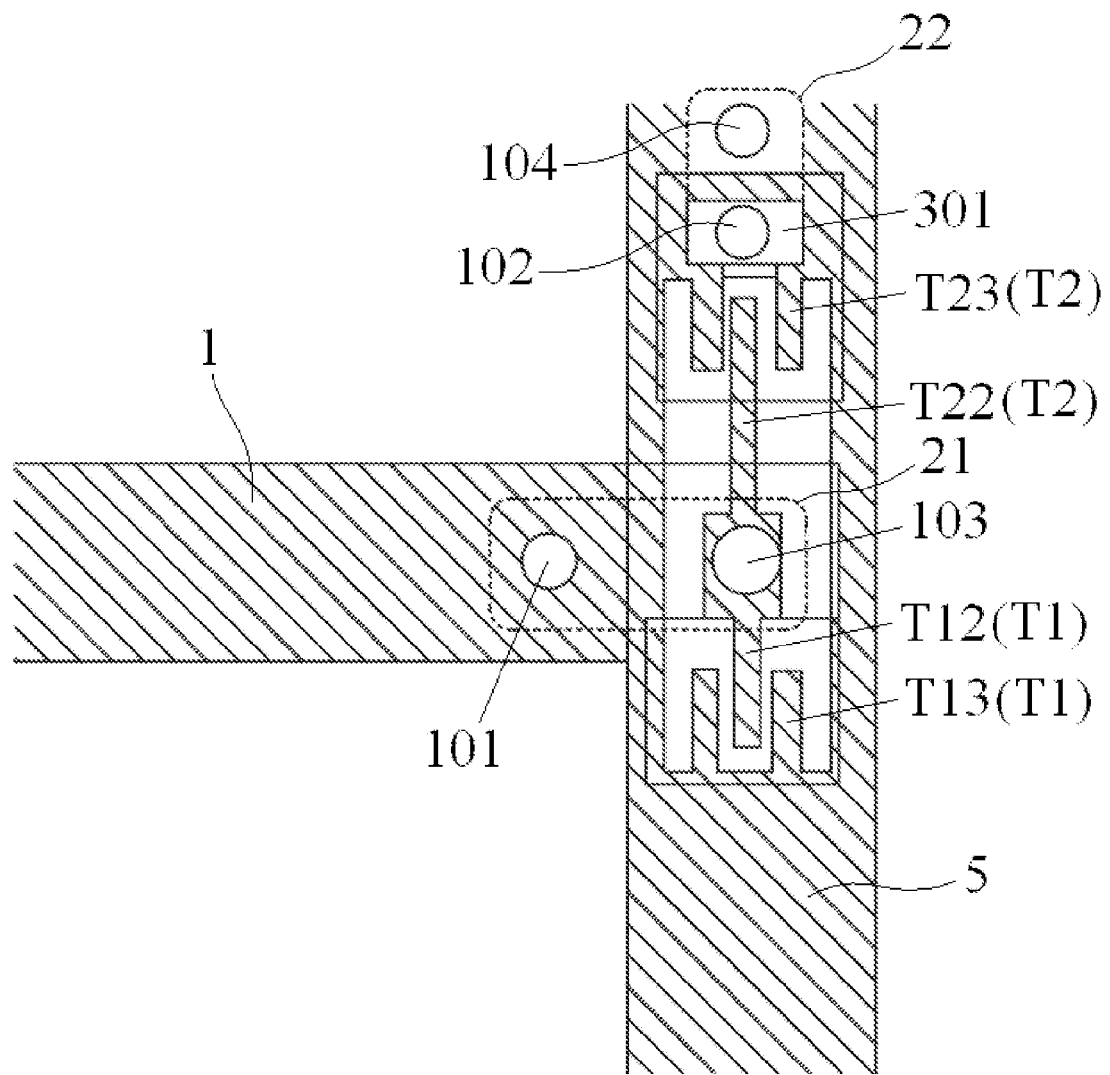
FIG. 1 is an illustrative view of a static electricity discharge structure of an array substrate at a side of the array substrate according to an exemplary embodiment of the present invention.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are disposed so that the present disclosure will be thorough and complete, and will fully convey the concept of the disclosure to those skilled in the art.

It should be appreciated that orientations or positions indicated by terms in the description of the present invention, such as, "center", "longitudinal", "lateral", "upper", "lower", "front", "rear", "left", "right", "vertical", "horizontal", "top", "bottom", "inside", "outside", etc., are based on orientations or positions shown in the drawings, and are intended to simplify the description of the present invention, and not to define or limit the indicated devices or elements to have or be configured and operated in the specific orientations. Accordingly, these terms are illustrative, and not restrictive to the present invention.

Also, in the descriptions of the present invention, unless explicitly stated to the contrary, the term "a plurality of" means two or more.

As shown in FIGS. 1-7, according to an embodiment of the present invention, there is provided an array substrate comprising a pixel region (a display region) and a periphery wiring region (a non-display region). An Electro-Static Discharge (ESD) assembly and a short-circuit ring are disposed in the periphery wiring region, and the ESD assembly comprises a plurality of Thin Film Transistors (TFTs) each having a source electrode and a drain electrode that are disposed within the short-circuit ring.

The source electrodes and the drain electrodes of the TFTs of the ESD assembly may be disposed within the short-circuit ring, so as to effectively reduce a horizontal distance occupied by the ESD assembly at each side of the display region of the substrate. At the same time, the position of the entire periphery circuit is offset toward the display region, and a distance between the display region and an edge of a glass panel (a region between the display region and an edge of a glass panel is a non-display region) can be effectively reduced, thereby achieving a good performance of the narrow edge frame of the TFT-LCD and enhancing the market competition of the TFT-LCD. Hereafter, it will describe in detail exemplary embodiments of the array substrate of the present with reference to FIGS. 1-7.

As shown in FIG. 1, the array substrate comprises a pixel region and a periphery wiring region. An Electro-Static Discharge (ESD) assembly and a short-circuit ring 5 are disposed in the periphery wiring region; and the ESD assembly comprises a plurality of Thin Film Transistors (TFTs), for example, a first TFT T1 and a second TFT T2. In the present invention, the source electrodes T12, T22 and the drain electrodes T13, T23 of the TFTs T1, T2 are disposed within the short-circuit ring 5.

In the illustrated embodiments, the ESD assembly comprises two TFTs, but the present invention is not limited to this, the number of the TFTs of the ESD may be set as three or more, that is, the number of the TFTs may be determined according to a practical application.

Figure 5:
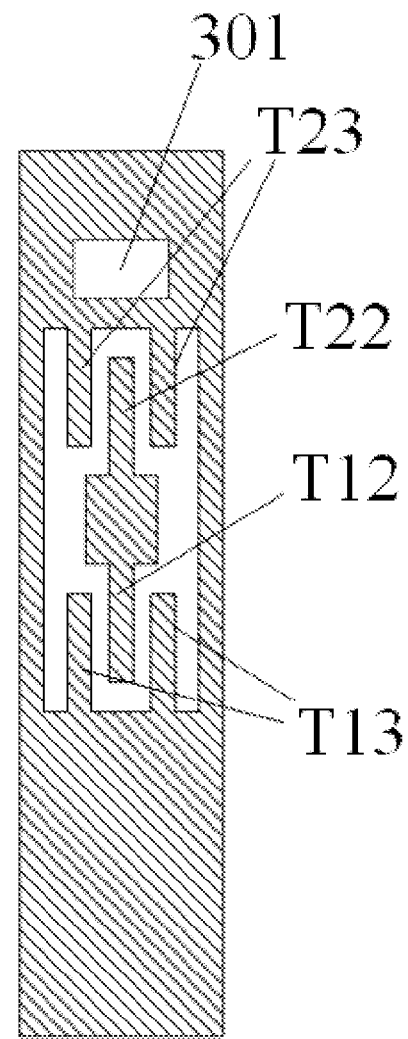

As shown in FIG. 1 and FIG. 5, in an exemplary embodiment, the source electrodes T12, T22 and the drain electrodes T13, T23 of the TFTs T1, T2 are formed in the same layer by a single patterning process. Please be noted that the source electrodes T12, T22 and the drain electrodes T13, T23 can be interchanged in the embodiment shown in FIG. 1 and FIG. 5, and the present invention is not limited to the illustrated embodiments.

Referring to FIG. 1 and FIG. 5, the ESD assembly comprises a first TFT T1 and a second TFT T2. The drain electrodes T13, T23 of the first and second TFTs T1, T2 are spaced opposite to each other and connected to the short-circuit ring 5. The source electrodes T12, T22 of the first and second TFTs T1, T2 are connected to each other and separated from the short-circuit ring 5.

Figure 2:
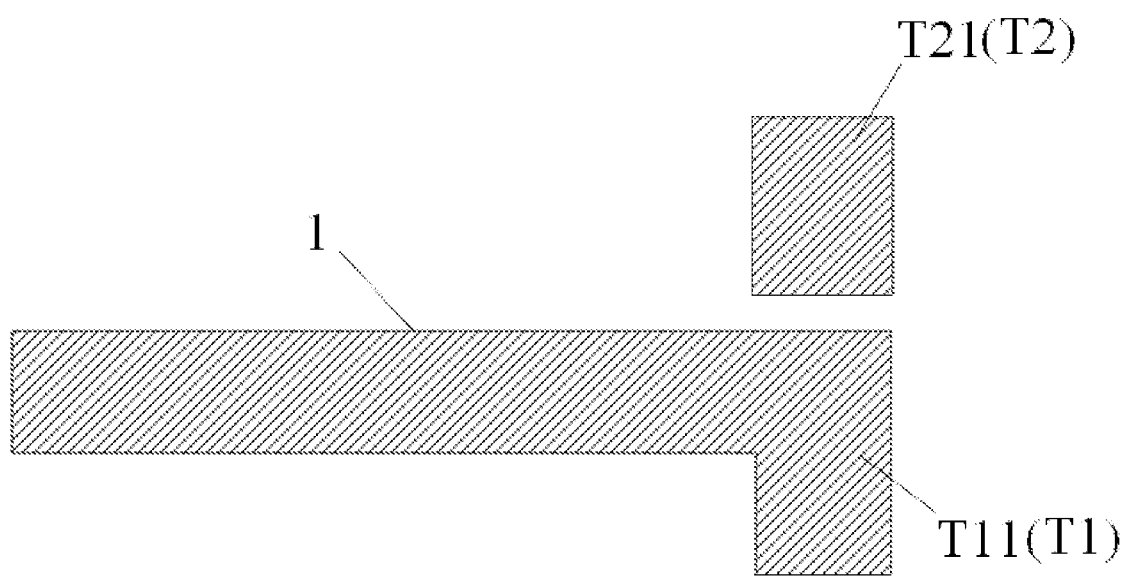

As shown in FIG. 1 and FIG. 2, the gate electrodes T11, T21 of the first and second TFTs T1, T2 are located within an area covered by the short-circuit ring 5.

In an exemplary embodiment, as shown in FIG. 1 and FIG. 2, the gate electrodes T11, T21 of the first and second TFTs T1, T2 and a gate line 1 of the pixel region are formed in the same layer by a single patterning process. The gate line 1 of the pixel region extends to the periphery wiring region and is connected to the gate electrode T11 of the first TFT T1. The gate electrode T21 of the second TFT T2 is separated from the gate electrode T11 of the first TFT T1 and the gate line 1.

Figure 7:
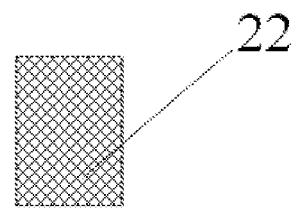
Figure 7:
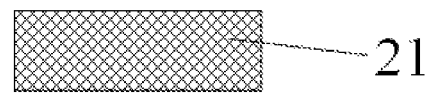

As shown in FIG. 1 and FIG. 7, the gate electrode T11 of the first TFT T1 is electrically connected to the source electrode T12 of the first TFT T1 through a first transparent conductive layer 21. The gate electrode T21 of the second TFT T2 is electrically connected to the drain electrode T23 of the second TFT T2 and the short-circuit ring 5 through a second transparent conductive layer 22.

Figure 6:
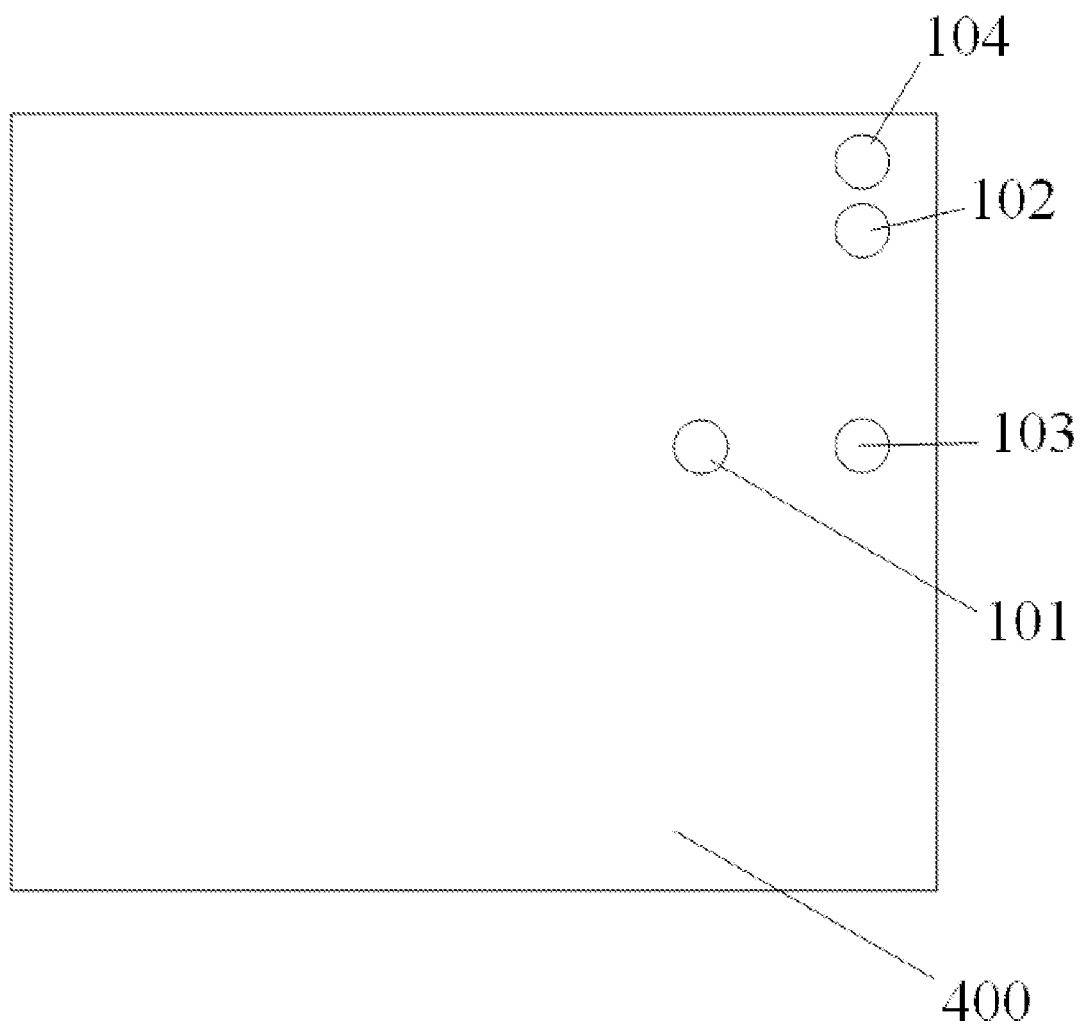

The first and second transparent conductive layers 21, 22 may be formed by depositing Indium Tin Oxide (ITO) on a second insulation layer 400 (see FIG. 6).

Hereafter, it will describe in detail an exemplary embodiment of producing the array substrate of the present with reference to FIGS. 1-7.

Figure 3:
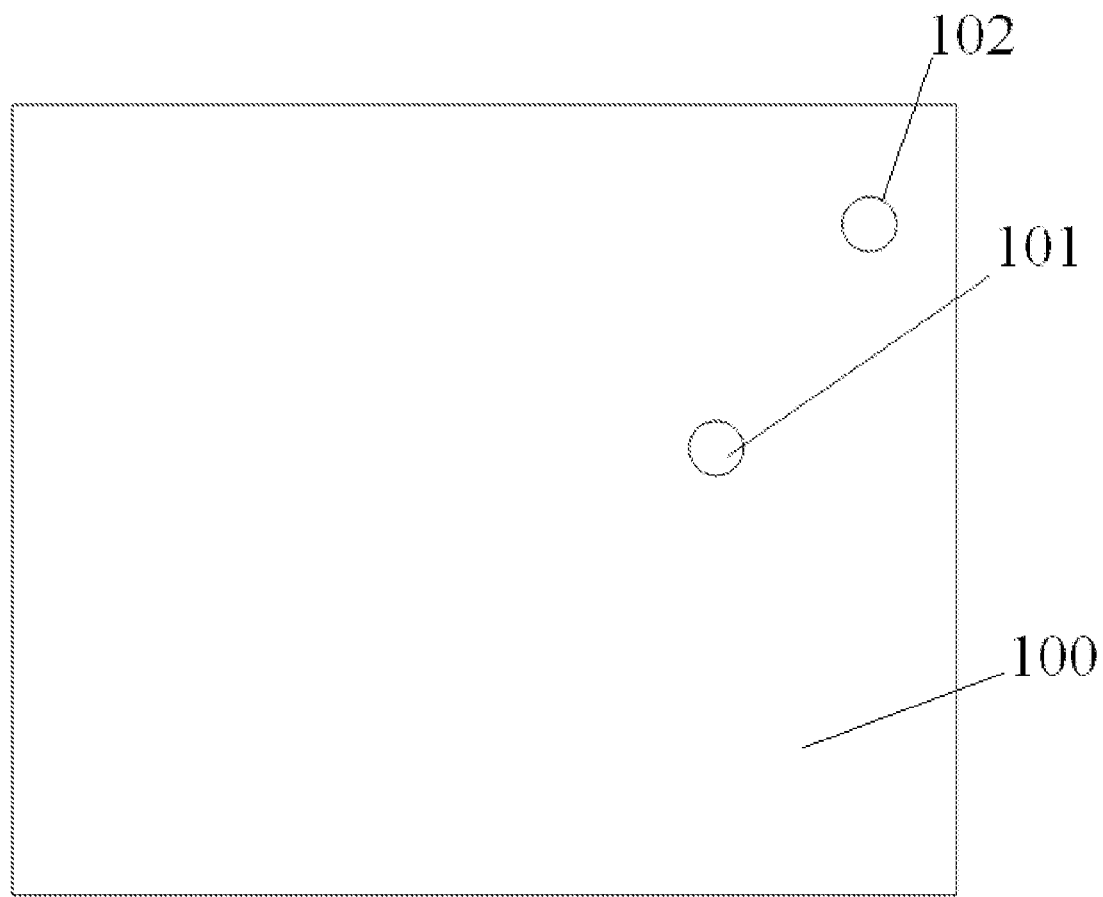
Figure 4:
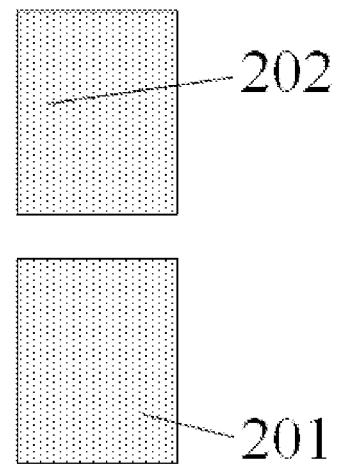

Firstly, as shown in FIG. 1 and FIG. 2, forming the gate line 1, the gate electrode T11 of the first TFT T1 and the gate electrode T21 of the second TFT T2 on a substrate (not shown) by a single patterning process, wherein the gate line 1 is connected to the gate electrode T11 of the first TFT T1 and separated from the gate electrode T21 of the second TFT T2;

Then, as shown in FIG. 1 and FIG. 3, forming a first insulation layer 100 on the gate line 1 and the gate electrodes T11, T21, please be noted that a first via 101 for exposing the gate line 1 and a second via 102 for exposing the gate electrode T21 of the second TFT T2 in the first insulation layer 100 shown in FIG. 3 may be formed individually or at a time by a single patterning process after forming a second insulation layer 400 as described hereafter;

Thereafter, as shown in FIG. 1 and FIG. 4, forming a first TFT active layer 201 and a second TFT active layer 202 on the first insulation layer 100 by a single patterning process, wherein the first and second TFT active layers 201, 202 are used to contact a source electrode T12 and a drain electrode T22 of first and second TFTs T1, T2 to be formed later;

Then, as shown in FIG. 1 and FIG. 5, forming source electrodes T12, T22 and drain electrodes T13, T23 of the first and second TFTs T1, T2 and the short-circuit ring 5 on the first and second TFT active layers 201, 202 by a single patterning process, wherein the short-circuit ring 5 is formed with a first opening 301 therein to expose the gate electrode T21 of the second TFT T2, and the source electrodes T12, T22 of the first and second TFTs T1, T2 are connected to each other and separated from the short-circuit ring 5, and the drain electrodes T13, T23 are connected to the short-circuit ring 5, and the source electrodes T12, T22 and the drain electrodes T13, T23 of the first and second TFTs T1, T2 are formed within the short-circuit ring 5;

Thereafter, as shown in FIG. 1 and FIG. 6, forming a second insulation layer 400 on the source electrodes T12, T22 and the drain electrodes T13, T23 of the first and second TFTs T1, T2 and the short-circuit ring 5, please be noted that a first via 101 for exposing the gate line 1, a second via 102 for exposing the gate electrode T21 of the second TFT T2, a third via 103 for exposing the source electrodes T12, T13 of the first and second TFTs T1, T2 and a fourth via 104 for exposing the short-circuit ring 5 in the second insulation layer 400 shown in FIG. 6 may be formed individually or at a time by a single patterning process after forming the first and second insulation layers 100, 400;

Finally, as shown in FIG. 1 and FIG. 7, forming a first transparent conductive layer 21 and a second transparent conductive layer 22 on the second insulation layer 400 by a single patterning process.

As shown in FIGS. 1-7, the first transparent conductive layer 21 is connected to the gate line 1 through the first via 101 and connected to the source electrodes T12, T22 of the first and second TFTs T1, T2 through the third via 103, so that the source electrodes T12, T22 of the first and second TFTs T1, T2 are connected to the gate line 1.

Referring to FIGS. 1-7, the second transparent conductive layer 22 is connected to the gate electrode T21 of the second FTF T2 through the second via 102 and the first opening 301, and connected to the short-circuit ring 5 through the fourth via 104, so that the gate electrode T21 of the second TFT T2 is connected to the drain electrodes T13, T23 of the first and second TFTs T1, T2 and the short-circuit ring 5.

On one hand, in the array substrate shown in FIG. 1, if there is a great amount of static electricity accumulated in the gate line 1, the static electricity can be transferred from the gate line 1 to the gate electrode T11 of the first TFT T1 directly. As a result, the first TFT T1 is switched on. Therefore, the static electricity transferred to the source electrode T12 of the first TFT T1 through the first transparent conductive layer 21, which connects the gate line 1 and the source electrode T12 of the first TFT T1, can be conducted to the drain electrode T13 of the first TFT T1 from the source electrode T12 of the first TFT T1 and further conducted to the short-circuit ring 5. In this way, the static electricity cannot be accumulated in the gate line 1 and can be dispersed on the gate line 1 and the short-circuit ring 5 to achieve a good electrostatic protection for the array substrate.

On the other hand, in the array substrate shown in FIG. 1, if there is a great amount of static electricity accumulated in the short-circuit ring 5, the static electricity can be transferred from the short-circuit ring 5 to the drain electrode T23 of the second TFT T2 directly. Since the drain electrode T23 of the second TFT T2 is connected to the gate electrode T21 of the second TFT T2 through the second transparent conductive layer 22, the static electricity can be transferred from the drain electrode T23 to the gate electrode T21 of the second TFT T2. As a result, the second TFT T2 is switched on. Therefore, the static electricity transferred to the drain electrode T23 of the second TFT T2 can be conducted to the source electrode T22 of the second TFT T2 and further conducted to the gate line 1. In this way, the static electricity cannot be accumulated in the short-circuit ring 5 and can be dispersed on the gate line 1 and the short-circuit ring 5 to achieve a good electrostatic protection for the array substrate.

In an exemplary embodiment of the present invention, the short-circuit ring 5, the source electrodes T12, T22 and the drain electrodes T13, T23 of the first and second TFTs T1, T2, and a data line (not shown) of the pixel region may be formed by a single patterning process.

In an exemplary embodiment of the present invention, in order to improve the production efficiency, the first via 101 in the pixel region and the second, third and fourth vias 102, 103, 104 in the periphery wiring region are be formed by a single patterning process after the first and second insulation layers 100, 400 have been formed. But the present is not limited to this, the corresponding first and second vias 101, 102 may be individually formed in the first insulation layer 100 (see FIG. 3) immediately after the first insulation layer 100 has been formed, and the corresponding first, second, third and fourth vias 101, 102, 103, 104 may be individually formed in the second insulation layer 400 (see FIG. 6) after the second insulation layer 400 has been formed.

According to an exemplary embodiment of the present invention, there also is provided a method for producing an array substrate, the array substrate comprising a pixel region where a gate line 1 is disposed and a periphery wiring region where a short-circuit ring 5 and an Electro-Static Discharge (ESD) assembly having a first Thin Film Transistors (TFT) T1 and a second TFT T2 are disposed, the method comprising a step of forming source electrodes and drain electrodes of the first and second TFTs within the short-circuit ring. More specifically, the method comprises steps of:

S100: forming the gate line 1, a gate electrode T11 of the first TFT T1 and a gate electrode T21 of the second TFT T2 on a substrate by a single patterning process, wherein the gate line 1 is connected to the gate electrode T11 of the first TFT T1 and separated from the gate electrode T21 of the second TFT T2;

S200: forming a first insulation layer 100 on the gate line 1 and the gate electrodes T11, T21;

S300: forming a first TFT active layer 201 and a second TFT active layer 202 on the first insulation layer 100 by a single patterning process;

S400: forming source electrodes T12, T22 and drain electrodes T13, T23 of the first and second TFTs T1, T2 and the short-circuit ring 5 on the first and second TFT active layers 201, 202 by a single patterning process, wherein the short-circuit ring 5 is formed with a first opening 301 therein to expose the gate electrode T21 of the second TFT T2, one kind of electrodes of the source electrodes T12, T22 and the drain electrodes T13, T23 of the first and second TFTs T1, T2 are connected to each other and separated from the short-circuit ring 5, and the other kind of electrodes are connected to the short-circuit ring 5, That is to say, the source electrodes T12, T22 are connected to each other and separated from the short-circuit ring 5, and the drain electrodes T13, T23 are connected to the short-circuit ring 5; alternatively, the drain electrodes T13, T23 are connected to each other and separated from the short-circuit ring 5, and the source electrodes T12, T22 are connected to the short-circuit ring 5;

S500: forming a second insulation layer 400 on the source electrodes T12, T22 and the drain electrodes T13, T23 of the first and second TFTs T1, T2 and the short-circuit ring 5; and S600: forming a first transparent conductive layer 21 and a second transparent conductive layer 22 on the second insulation layer 400 by a single patterning process, wherein a first via 101 for exposing the gate line and a second via 102 for exposing the gate electrode T21 of the second TFT T2 are formed in the first and second insulation layers 100, 400, respectively, and a third via 103 for exposing the one kind of electrodes of the first and second TFTs T1, T2 and a fourth via 104 for exposing the short-circuit ring 5 are formed in the second insulation layer 400, wherein the first transparent conductive layer 21 is connected to the gate line 1 through the first via 101 and connected to the one kind of electrodes of the first and second TFTs T1, T2 through the third via 103, so that the one kind of electrodes of the first and second TFTs T1, T2 is connected to the gate line 1, wherein the second transparent conductive layer 22 is connected to the gate electrode T21 of the second FTF T2 through the second via 102 and the first opening 301 and connected to the short-circuit ring 5 through the fourth via 104, so that the gate electrode T21 of the second TFT T2 is connected to the other kind of electrodes of the second and second TFTs T1, T2 and the short-circuit ring 5, and wherein the source electrodes T12, T22 and drain electrodes T13, T23 of the first and second TFTs T1, T2 are formed within the short-circuit ring 5.

In addition, in an exemplary embodiment, the present invention also provides a display apparatus comprising the above mentioned array substrate. The display apparatus may be used as any product or member with a display function, such as, a liquid crystal panel, an electrical paper, OLED panel, a liquid crystal TV, a liquid crystal display, a digital photo frame, a mobile telephone, a panel computer, and so on.

As described herein, the source electrodes and the drain electrodes of the TFTs of the ESD assembly may be disposed within the short-circuit ring, so as to effectively reduce a horizontal distance occupied by the ESD assembly at each side of the display region of the substrate. At the same time, it offsets the position of the entire periphery circuit toward the display region, and can effectively reduce a distance between the display region and an edge of a glass panel (a region between the display region and an edge of a glass panel is a non-display region), thereby achieving a good performance of the narrow edge frame of the TFT-LCD and enhancing the market competition of the TFT-LCD.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. An array substrate comprising a pixel region and a periphery wiring region,
   wherein an Electro-Static Discharge (ESD) assembly and a short-circuit ring are disposed in the periphery wiring region; and
   wherein the ESD assembly comprises a plurality of Thin Film Transistors (TFTs) each having a source electrode and a drain electrode that are disposed within a coverage area of a body of the short-circuit ring.

2. The array substrate according to claim 1,
   wherein the source electrodes and the drain electrodes of the TFTs and the short-circuit ring are formed in the same layer by a single patterning process.

3. The array substrate according to claim 2,
   wherein one kind of electrodes of the source electrodes and the drain electrodes of the TFTs are connected to the short-circuit ring, and the other kind of electrodes are connected to each other and separated from the short-circuit ring.

4. The array substrate according to claim 3,
   wherein the ESD assembly comprises a first TFT and a second TFT,
   wherein the drain electrodes of the first and second TFTs are spaced opposite to each other and connected to the short-circuit ring, and
   wherein the source electrodes of the first and second TFTs are connected to each other and separated from the short-circuit ring.

5. The array substrate according to claim 4,
   wherein gate electrodes of the first and second TFTs are located within a coverage area of the body of the short-circuit ring.

6. The array substrate according to claim 5,
   wherein the gate electrodes of the first and second TFTs and a gate line of the pixel region are formed in the same layer by a single patterning process,
   wherein the gate line of the pixel region extends to the periphery wiring region and is connected to the gate electrode of the first TFT, and
   wherein the gate electrode of the second TFT is separated from the gate electrode of the first TFT and the gate line.

7. The array substrate according to claim 6,
   wherein the gate electrode of the first TFT is electrically connected to the source electrode of the first TFT through a first transparent conductive layer,
   wherein the gate electrode of the second TFT is electrically connected to the drain electrode of the second TFT and the short-circuit ring through a second transparent conductive layer, and
   wherein the first and second transparent conductive layers are formed in the same layer by a single patterning process.

8. A display apparatus comprising an array substrate according to claim 1.

9. A method for producing the array substrate according to claim 1,
   comprising:
   forming source electrodes and drain electrodes of the TFTs within the coverage area of the body of the short-circuit ring.

10. The method according to claim 9,
    wherein the source electrodes and the drain electrodes of the TFTs and the short-circuit ring are formed in the same layer by a single patterning process.

11. The method according to claim 10,
    wherein one kind of electrodes of the source electrodes and the drain electrodes of the TFTs are connected to the short-circuit ring, and the other kind of electrodes are connected to each other and separated from the short-circuit ring.

12. The method according to claim 11,
    wherein the ESD assembly comprises a first TFT and a second TFT,
    wherein the drain electrodes of the first and second TFTs are spaced opposite to each other and connected to the short-circuit ring, and
    wherein the source electrodes of the first and second TFTs are connected to each other and separated from the short-circuit ring.

13. The method according to claim 12,
    wherein gate electrodes of the first and second TFTs are located within a coverage area of the short-circuit ring.

14. The method according to claim 13,
    wherein the gate electrodes of the first and second TFTs and a gate line of the pixel region are formed in the same layer by a single patterning process,
    wherein the gate line of the pixel region extends to the periphery wiring region and is connected to the gate electrode of the first TFT, and
    wherein the gate electrode of the second TFT is separated from the gate electrode of the first TFT and the gate line.

15. The method according to claim 14,
    wherein the gate electrode of the first TFT is electrically connected to the source electrode of the first TFT through a first transparent conductive layer,
    wherein the gate electrode of the second TFT is electrically connected to the drain electrode of the second TFT and the short-circuit ring through a second transparent conductive layer, and
    wherein the first and second transparent conductive layers are formed in the same layer by a single patterning process.

16. A method for producing the array substrate according to claim 1, the Electro-Static Discharge (ESD) assembly having a first Thin Film Transistor (TFT) and a second TFT, wherein the method comprises steps of:

forming a gate line, a gate electrode of the first TFT and a gate electrode of the second TFT on a substrate by a single patterning process, wherein the gate line is connected to the gate electrode of the first TFT and separated from the gate electrode of the second TFT;

forming a first insulation layer on the gate line and the gate electrodes;

forming a first TFT active layer and a second TFT active layer on the first insulation layer by a single patterning process;

forming source electrodes and drain electrodes of the first and second TFTs and the short-circuit ring on the first and second TFT active layers by a single patterning process, wherein the short-circuit ring is formed with a first opening therein to expose the gate electrode of the second TFT, one kind of electrodes of the source electrodes and the drain electrodes of the first and second TFTs are connected to each other and separated from the short-circuit ring, and the other kind of electrodes are connected to the short-circuit ring;

forming a second insulation layer on the source electrodes and the drain electrodes of the first and second TFTs and the short-circuit ring; and forming a first transparent conductive layer and a second transparent conductive layer on the second insulation layer by a single patterning process, wherein a first via for exposing the gate line and a second via for exposing the gate electrode of the second TFT are formed in the first and second insulation layers, respectively, and a third via for exposing the one kind of electrodes of the first and second TFTs and a fourth via for exposing the short-circuit ring are formed in the second insulation layer, wherein the first transparent conductive layer is connected to the gate line through the first via and connected to the one kind of electrodes of the first and second TFTs through the third via, so that the one kind of electrodes of the first and second TFTs is connected to the gate line, wherein the second transparent conductive layer is connected to the gate electrode of the second FTF through the second via and the first opening and connected to the short-circuit ring through the fourth via, so that the gate electrode of the second TFT is connected to the other kind of electrodes of the first and second TFTs and the short-circuit ring, and wherein the source electrodes and drain electrodes of the TFTs are formed within the coverage area of the body of the short-circuit ring.

17. The method according to claim 16,
wherein the drain electrodes of the first and second TFTs are spaced opposite to each other and connected to the short-circuit ring, and
wherein the source electrodes of the first and second TFTs are connected to each other and separated from the short-circuit ring.

18. The method according to claim 17,
wherein the gate electrodes of the first and second TFTs are located within a coverage area of the short-circuit ring.

19. The method according to claim 16,
wherein the short-circuit ring, the source electrodes and the drain electrodes of the first and second TFTs, and a data line of the pixel region are formed by a single patterning process.

20. The method according to claim 16,
wherein the first via in the pixel region and the second, third and fourth vias in the periphery wiring region are formed by a single patterning process.

* * * * *